(12) United States Patent
Loertscher

(10) Patent No.: US 10,762,962 B2
(45) Date of Patent: *Sep. 1, 2020

(54) STATE-CHANGEABLE DEVICE

(71) Applicant: International Business Machines Corporation, Armonk, NY (US)

(72) Inventor: Emanuel Loertscher, Bonstetten (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/115,829

(22) Filed: Aug. 29, 2018

(65) Prior Publication Data

US 2019/0013073 A1    Jan. 10, 2019

Related U.S. Application Data

(60) Division of application No. 15/366,352, filed on Dec. 1, 2016, now Pat. No. 10,102,906, which is a (Continued)

(30) Foreign Application Priority Data

Aug. 30, 2013    (GB) .................................. 13155080

(51) Int. Cl.
*G11C 11/42*        (2006.01)
*G11C 13/02*        (2006.01)
(Continued)

(52) U.S. Cl.
CPC .......... *G11C 13/047* (2013.01); *G02F 1/0126* (2013.01); *G02F 3/00* (2013.01); (Continued)

(58) Field of Classification Search
CPC ..... G11C 13/047; G11C 11/42; G11C 13/025; G11C 13/044; G11C 2213/77
See application file for complete search history.

(56) References Cited

U.S. PATENT DOCUMENTS

| | | |
|---|---|---|
| 5,049,462 A | 9/1991 | Funhoff et al. |
| 5,347,395 A | 9/1994 | Lautenschlager et al. |

(Continued)

FOREIGN PATENT DOCUMENTS

| | | |
|---|---|---|
| CN | 103094404 A | 5/2013 |
| CN | 103154804 A | 6/2013 |

(Continued)

OTHER PUBLICATIONS

List of IBM Patents or Applications Treated as Related.
(Continued)

*Primary Examiner* — Ly D Pham
(74) *Attorney, Agent, or Firm* — Amin, Turocy & Watson, LLP

(57) ABSTRACT

A state-changeable device includes a first and a second particle arranged in proximity to each other; and a coupling material between the first and the second particle; wherein the first and the second particle are adapted to provide a charge carrier distribution such that surface plasmon polaritons (SPP) occur; and the coupling material is adapted to exhibit a variable conductivity in response to a trigger signal thereby changing an electro-optical coupling between the first and the second particle.

11 Claims, 7 Drawing Sheets

Related U.S. Application Data continuation of application No. 14/914,030, filed as application No. PCT/IB2014/063915 on Aug. 14, 2014, now Pat. No. 9,595,328.

(51) Int. Cl.

| | | |
|---|---|---|
| *G11C 13/04* | (2006.01) | |
| *G02F 1/01* | (2006.01) | |
| *G02F 3/00* | (2006.01) | |
| G02B 6/26 | (2006.01) | |
| G02B 6/122 | (2006.01) | |
| G02B 5/00 | (2006.01) | |
| B82Y 10/00 | (2011.01) | |
| B82Y 20/00 | (2011.01) | |

(52) U.S. Cl.
CPC ............ *G11C 11/42* (2013.01); *G11C 13/025* (2013.01); *B82Y 10/00* (2013.01); *B82Y 20/00* (2013.01); *G02B 5/008* (2013.01); *G02B 6/1225* (2013.01); *G02B 6/1226* (2013.01); *G02B 6/1228* (2013.01); *G02B 6/262* (2013.01); *G02B 2207/101* (2013.01); *G02F 2203/10* (2013.01); *G11C 13/044* (2013.01); *G11C 2213/77* (2013.01)

(56) References Cited

U.S. PATENT DOCUMENTS

| | | | |
|---|---|---|---|
| 6,046,925 | A | 4/2000 | Tsien et al. |
| 6,977,767 | B2 | 12/2005 | Sarychev et al. |
| 7,826,174 | B2 | 11/2010 | Takahashi et al. |
| 7,978,394 | B1 | 7/2011 | Johnson et al. |
| 8,107,151 | B1 | 1/2012 | Ptasinski et al. |
| 8,314,445 | B2 | 11/2012 | Rudenja et al. |
| 8,368,990 | B2 | 2/2013 | Ahn |
| 8,422,289 | B2 | 4/2013 | Kim et al. |
| 2003/0133339 | A1 | 7/2003 | Estes et al. |
| 2005/0185686 | A1 | 8/2005 | Rupasov et al. |
| 2005/0211978 | A1 | 9/2005 | Bu et al. |
| 2007/0253051 | A1 | 11/2007 | Ishihara et al. |
| 2008/0174509 | A1 | 7/2008 | Williams |
| 2009/0034055 | A1 | 2/2009 | Gibson |
| 2009/0195782 | A1 | 8/2009 | Blumberg et al. |
| 2010/0034007 | A1 | 2/2010 | Ham |
| 2011/0109821 | A1 | 5/2011 | Tang et al. |
| 2011/0109845 | A1 | 5/2011 | Tang et al. |
| 2011/0109854 | A1 | 5/2011 | Tang et al. |
| 2011/0109956 | A1 | 5/2011 | Hashimura et al. |
| 2011/0116168 | A1 | 5/2011 | Nikoobakht |
| 2011/0192248 | A1 | 8/2011 | Lopez et al. |
| 2012/0120474 | A1 | 5/2012 | Ham et al. |
| 2012/0293854 | A1 | 11/2012 | Zheludev et al. |
| 2013/0155484 | A1* | 6/2013 | Sweatlock ................ G02F 1/23 359/282 |
| 2013/0201544 | A1 | 8/2013 | Lezec et al. |
| 2014/0294338 | A1 | 10/2014 | Long et al. |

FOREIGN PATENT DOCUMENTS

| | | | |
|---|---|---|---|
| JP | 2004172164 | A | 6/2004 |
| JP | 2005351941 | A | 12/2005 |
| JP | 2006323099 | A | 11/2006 |
| JP | 2007328188 | A | 12/2007 |
| JP | 2008242300 | A | 10/2008 |
| JP | 2010185970 | A | 8/2010 |
| WO | 2008040759 | A1 | 4/2008 |
| WO | 2009/028424 | A1 | 3/2009 |
| WO | 2012057802 | A1 | 5/2012 |
| WO | 2012/173071 | A1 | 12/2012 |

OTHER PUBLICATIONS

Notice of Allowance dated Sep. 9, 2016 for U.S. Appl. No. 14/914,030, 26 pages.
Berkovitch et al., "Thin Wire Shortening of Plasmonic Nanparticle Dimers: The reason for Red Shifts", Nano Lett., 2011, 11, pp. 2079-2082.
Irie, "Photochromism: Memories and Switches Introduction", Chem. Rev., 2000 vol. 100 No. 5, pp. 1683-1684.
S. J. Van Der Molen et al., "Stochastic and photochromic switching of diarylethenes studied by scanning tunnelling microscopy", Nanotechnology vol. 17, pp. 310, 2006.
Liu et al., "Three-Dimensional Plasmon Rulers", Science, vol. 332 Issue 6026, pp. 1407-1410, Jun. 17, 2011.
Arnaud Spangenberg et al: "Photoswitchable interactions between photochromic organic diarylethene and surface plasmon resonance of gold nanoparticles in hybrid thin films", Physical Chemistry Chemical Physics vol. 15, No. 24, Mar. 15, 2013 (Mar. 15, 2013), p. 9670, XP055161530, ISSN: 1463-9076, DOI: 10.1039/c3cp50770j.
Chaplin J C et al: "Implementing conventional logic unconventionally: Photochromic molecular populations as registers and logic gates", Biosystems, North-Holland, Amsterdam, NL, vol. 109, No. 1, Dec. 27, 2011, (Dec. 27, 2011), pp. 35-51, XP028519682, ISSN: 0303-2647, DOI: 10.1016/J.Biosystems.2011.12.005.
Chen-Han Huang et al: "Tunable Photoconductivity of Porous Anodic Aluminum Oxide with Silver Nanoparticles", Electrochemical and Solid-State Letters, vol. 15, No. 3, Jan. 1, 2012 (Jan. 1, 2012), p. J14, XP055161482, ISSN: 1099-0062, DOI: 10.1149/2.020203esl.
Holger Lange et al: "Tunable Plasmon Coupling in Distance-Controlled Gold Nanoparticles", Langmuir, vol. 28, No. 24, Jun. 19, 2012 (Jun. 19, 2012), pp. 8862-8866, XP055162066, ISSN: 0743-7463, DOI: 10.1021/la3001575.
Masaya Mitsuishi et al: "Photofunctional thin film devices composed of polymer nanosheet assemblies", Journal of Materials Chemistry, vol. 19, No. 3, Jan. 1, 2009 (Jan. 1, 2009), p. 325, XP055161512, ISSN: 0959-9428, DOI: 10.1039/b805735b.
Ming-Shien Hu et al: "Photosensitive gold-nanoparticle-embedded dielectric nanowires", Nature Materials, Nature Publishing Group, London, GB, vol. 5, Feb. 22, 2006 (Feb. 22, 2006), pp. 102-106, XP002506308, ISSN: 1476-4660, DOI: 10.1038/NMAT1564.
Sethi Purnima et al., "All-optical reversible logic gates with microresonators", Photonics 2010: Tenth International Conference on Fiber Optics and Photonics, SPIE, 1000 20th St. Bellingham WA 98225-6705 USA, vol. 8173, No. 1, Dec. 29, 2010 (Dec. 29, 2010), pp. 1-8, XP060016311, DOI:10.1117/12.897970 [retrieved on Jan. 1, 1901].
International Search Report and Written Opinion for PCT Application No. PCT/IB2014/063915 dated Jan. 26, 2015, 10 pages.
First Search for Chinese Application No. 2014800468556 dated Nov. 21, 2017, 1 page.
Office Action received for U.S. Appl. No. 15/366,352, dated Dec. 29, 2017, 38 pages.
Non-Final Office Action received for U.S. Appl. No. 16/115,818 dated Jun. 12, 2019, 68 pages.
Second Office Action received for Chinese Patent Application Serial No. 201480046855.6 dated May 3, 2018, 10 pages (Including English Translation).
Third Office Action received for Chinese Patent Application Serial No. 201480046855. 6 dated Nov. 5, 2018, 8 pages (Including English Translation).
Notice of Reasons for Refusal received for Japanese Patent Application Serial No. 2016-537407 dated Jul. 10, 2018, 9 pages.
Decision to Grant a Patent received for Japanese Patent Application Serial No. 2016-537407 dated Jun. 4, 2019, 7 pages.
Non-Final Office Action received for U.S. Appl. No. 16/115,818 dated Oct. 31, 2019, 42 pages.

* cited by examiner

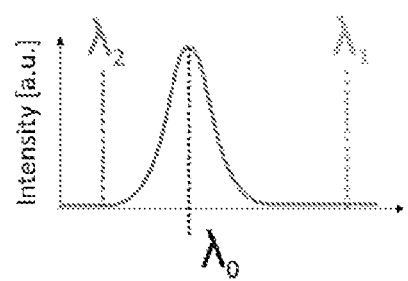
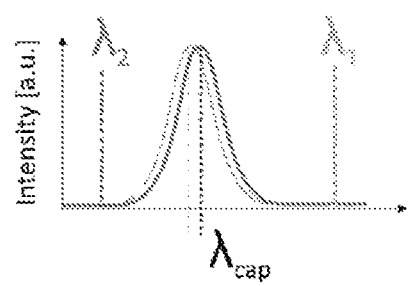
Fig. 3A Fig. 3B
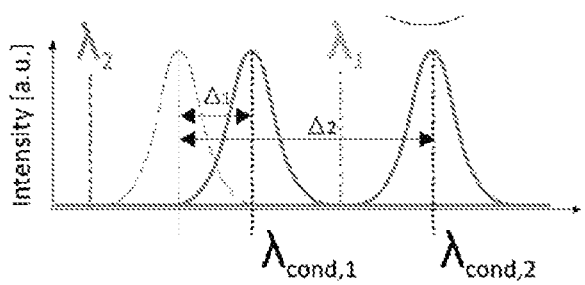
Fig. 3C

STATE-CHANGEABLE DEVICE

FIELD OF INVENTION

This disclosure relates to a state-changeable device, and more particularly to a device showing electro optical excitations, such as plasmonic excitations used to define logic states. In particular, nanoscale objects are employed that can be selectively coupled with each other through charge transfer. This disclosure also relates to memory devices and switching devices based on embodiments of the state-changeable device. Further, a method for storing a memory state is provided.

BACKGROUND

In modern telecommunications and electronics, semiconductor-based and photonic-based circuits are used to achieve highly integrated miniature-size components with high bandwidth and high-speed processing capacity. However, semiconductor CMOS-based electronics face fundamental energy and scaling limitations. According to the International Technology Roadmap for Semiconductors (ITRS) it is aimed at 22 nm structures forming integrated circuit chips in the year 2015. Presently, photonic components, for example, based on silicon photonic waveguides at present use 65 nm technologies. Photonic concepts, however, are fundamentally limited by the wavelength being used, e.g. currently 1550 nm for Si photonics. Smaller dimensions usually lead to frustrated modes with a considerable reduction in bandwidth. To benefit from large bandwidth and high speed, a miniaturization of photonics concepts below the diffraction limit given by the employed wave lengths is therefore highly desirable.

Conventionally, information carried by photons needs to be converted into electric signals for further processing, routing or manipulation. This is because mass and chargeless photons do not interact (strongly). The conversion from optical into electronic signals requires large amounts of energy. This additional step decreases the possible bandwidth, processing and communication speed. Conventionally, miniaturized solid-state lasers, photonic waveguides and photo detectors are used. It would be desirable to provide information or signal processing means that potentially dispense with such solid-state lasers and photo detectors. It would also be desirable to realize sub-wavelength devices for light manipulation and logic operations such as switching or routing.

SUMMARY OF THE INVENTION

Accordingly, embodiments of a state-changeable device includes at least a first and a second particle; and a coupling material between the first and the second particle; wherein the first and the second particle are adapted to provide a charge carrier distribution such that surface plasma polaritons (SPP) occur; and the coupling material is adapted to exhibit a variable conductivity in response to a trigger signal for changing an electro-optical coupling between the first and the second particle.

Embodiments of the state-changeable device can be used to switch light and store information which can be read out non-destructively. Hence, embodiments of a memory device includes at least one state-changeable device as disclosed before. Preferably, a first memory state is assigned to the first SPP configuration, and the second memory state is assigned to the second SPP configuration, e.g. the hybridized SPP configuration.

According to an embodiment of another aspect of the invention there is provided a method for storing a memory state, an embodiment of the method including the steps of providing a first and a second particle arranged in proximity to each other; and electro-optically coupling the first and the second particle through a coupling material, wherein the particles are adapted to provide a charge carrier distribution such that surface plasmon polaritons (SPP) occur, and wherein the coupling material is adapted to exhibit a variable conductivity in response to a trigger signal, e.g. an irradiated switching light.

BRIEF DESCRIPTION OF THE DRAWINGS

In the following, embodiments of state-changeable structures, devices and methods relating to such are described with reference to the enclosed drawings.

FIG. 3 shows diagrams (FIGS. 3A to 3C) illustrating the coupling of plasmonic excitations between particles.

Like or functionally like elements in the drawings have been allotted the same reference characters, if not otherwise indicated.

DETAILED DESCRIPTION OF THE PREFERRED EMBODIMENTS

In the following, the term "particle" refers to a solid-state entity. The geometry of a particle can be spherical, rod-like or of any arbitrary shape. For example, bow-tie antenna-type particles can be contemplated. One can also refer to an "object".

Single and interacting particles in this disclosure have a charge distribution in at least their surface regions that allow for surface plasmons (SP) to develop. Plasmon refers to a collective oscillation or excitation of mobile charge carriers, for example under an incident electromagnetic field. Surface plasmons can be referred to as electron density waves along a metal dielectric interface. For example, particles are provided proximate to each other and are separated by a dielectric medium. Plasmonic excitations can have frequencies corresponding to frequencies of the ultraviolet and infrared spectrum.

Surface plasmons can propagate along the metal-dielectric interface and are sometimes referred to as surface plasmon polaritons (SPP) when the coupling with a photon occurs. In this disclosure, generally SPPs are used as (logic) state defining means, however, coherent electron oscillations referred to as plain surface plasmons SPs can be employed as well.

In this disclosure, it is referred to "nano-scale" particles, "nanoparticles" or "nano-objects". Compared to the wavelengths of the electromagnetic radiation used in the context of state change devices, i.e. switching light, the extension of the nanoparticles is less than the wavelength of the used light. For example, nano-scale particles can have a largest extension between 1 nm and 100 nm. However, in particular circumstances, particles having an extension of 500 nm can be referred to as nanoparticles.

In this disclosure, the term "capacitive coupling" is used for a coupling of two particles without the exchange of any charge carriers. The term "electronic coupling" or "conductive coupling" is used where a charge carrier exchange between two particles occurs.

The term "trigger signal" shall include any external stimulus, excitation or challenge that can lead to a change of the coupling between nanoparticles due to a change of a coupling material. The following disclosure of embodiments refers to switching light as a possible trigger signal, however signals based on electric fields, magnetic fields, temperature changes or the like can also be used. In particular the term "switching light" can be understood to include any electromagnetic radiation including infrared light or thermal excitations. Also particle-like 'radiation', as gamma or x-rays can be contemplated.

Figure 1:
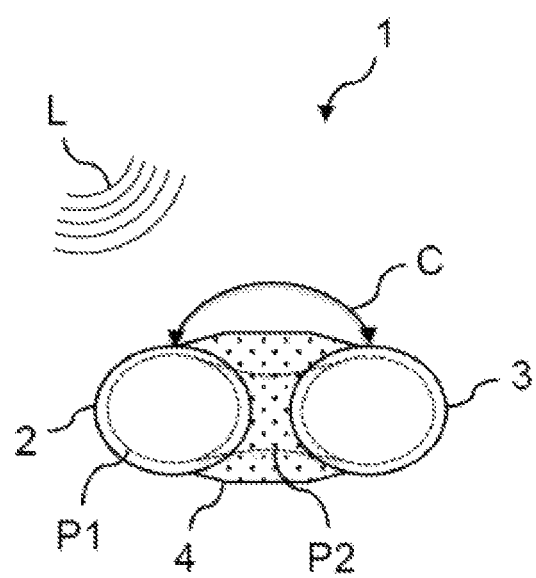
FIG. 1 shows a schematic diagram of a first embodiment of a state-changeable device.

FIG. 1 shows a first embodiment of a state-changeable device 1. The embodiment of a state-changeable device 1 includes a first particle 2 and a second particle 3. The particles are implemented as nanoparticles having an extension of several nanometers. The particles 2, 3 are placed close to each other wherein between the two particles 2, 3 a coupling medium 4 is placed. The particles 2, 3 are, for example, metallic particles or highly-doped semiconductor particles that carry free charge-carriers that allow for a surface plasmon generation.

If the particles 2, 3 are only capacitively coupled, for example, surface plasmons P1 are generated under incident light irradiation (L). P1 has a specific energy. In certain conditions of the coupling material 4, the two particles 2, 3 are strongly coupled, i.e. conductive, such that a charge transfer from particle 2 to the particle 3 through the coupling material 4 can occur. This alternation of coupling leads to a changed P1 mode, or to a hybridized or collective surface plasmon configuration P2. The coupling between the particles 2, 3 is indicated by the arrow C.

The coupling material 4 can be switched between conductive behavior and insulating behavior through an external trigger or stimulus, e.g. light irradiation. Switching light L of a specific frequency or wavelength can alternate the coupling material 4 from one state to another and vice versa. For example, irradiating the embodiment of a state-changeable device 1 with a switching light L having a frequency $v_1$ or wavelength $\lambda_1$, leads to conductive coupling of the two particles 2, 3 thereby allowing for the hybridized SP configuration P2. Irradiating with another switching frequency, for example, $v_2$ or wavelength $\lambda_2$ switches the coupling material 4 back into its insulating state, leading to initial SP configuration P1. By detecting the SP configuration of the device 1, a respective logic state can be defined and stored.

Only as an example, the particles 2, 3 are gold spheres. Single gold spheres having a diameter of 2 nm show resonances, i.e. SP excitations at 3.8 eV corresponding to 326 nm. 8 nm gold spheres show slightly different energy spectra for SPs with a main resonance at 3.2 eV corresponding to 390 nm. One can also contemplate of silver spheres that show surface plasmon resonances at 3.2 eV and bulk resonances at a 3.9 eV, if the spheres have a diameter of approximately 20 nm. Generally, the larger the nanoparticle the larger the main resonance energy. For example, investigations show that 100 nm gold nanoparticles have resonances at 480 nanometers. One can also contemplate of other materials and geometries of the nanoparticles. The state-changeable device can be composed with identical or asymmetric particles 2 and 3, giving degrees of freedom to tailor the desired SPP mode P2.

Figure 2:
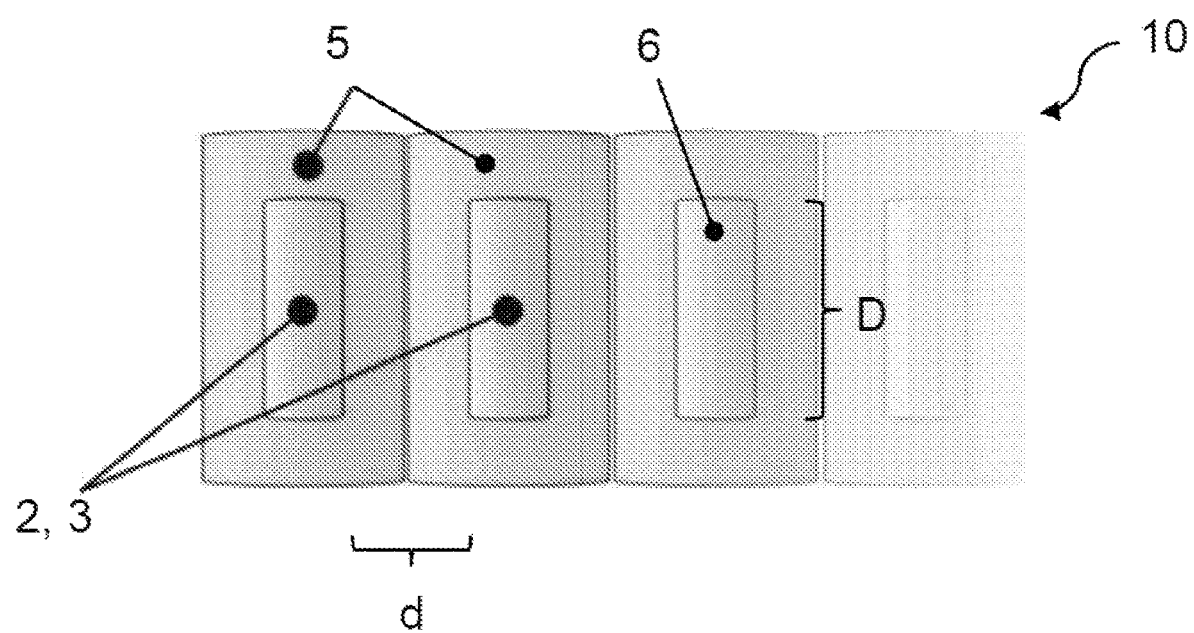
FIG. 2 shows a schematic diagram of a second embodiment of a state-changeable device.

FIG. 2 shows a second embodiment of a state-changeable device based on nanoparticles. The embodiment 10 shows several nanoparticles 2, 3, 6 that are coated with an active coating 5. The dimensions of the nanoparticles 2, 3, 6 which have a rod-like shape are indicated as D. The particles 2, 3, 6 are separated by the distance d which can be a few nanometers. The coating 5 acts as a coupling medium or coupling material between the nanoparticles. As explained with respect to FIG. 1, the coupling material can be switched between conductive and insulating behavior by an external trigger, e.g. light irradiation. One can also refer to nano-rods for the nanoparticles 2, 3, 6. The minimum distance between the nanoparticles 2, 3, 6 is for example given by the onset of tunneling events between the particles 2, 3, 6. Preferably, the distance d is chosen such that no tunneling of charge carrier can occur.

The structure shown in FIG. 2 allows for sub-wavelength dimensions, i.e. plasmonic phenomena having energies corresponding to a larger wavelength than the geometric dimension of the structure 10. The developing SPPs mode dependent on size, geometry and the material composition and morphology of the nanoparticles 2, 3, 6 and the coupling material 5. For example, a crystalline material of particles 2, 3, 6 can display a different plasmonic spectrum than an amorphous material.

FIG. 3 illustrates the intensity of SPP modes in arbitrary units (a.u.) as a function of the respective wavelengths.

FIG. 3A shows a single nanoparticle 2 which is isolated and exhibits a surface plasmon with a resonance corresponding to wavelength $\lambda_0$. The resonance can generally be in any range between the ultraviolet and infrared spectrum. If another nanoparticle 3 is brought in close proximity (a threshold given by the near-field of particle 2 and 3) with the first nanoparticle 2, the SPP modes can start to overlap and finally interact with each other (depending on the distance), for example through image charges leading to a collective SPP mode. FIG. 3B shows two nanoparticles 2, 3 close to each other that only interact capacitively. The lower graph shows how the two SPP resonances are shifted with respect to the single particle configuration shown in FIG. 3A. This is indicated by $\lambda_{cap}$ referring to capacitive coupling between the particles 2, 3. The coupling is purely capacitive, e.g. defined by the surrounding medium or, for example, the dielectric material of an underlying substrate. The interaction, and therefore the shift of energy levels of the SPP is weak. For example, the shift $\lambda_{cap}-\lambda_0$ is 10-50 nm.

However, if an electric coupling giving rise to electron exchange is enabled by a coupling material between the two particles 2, 3, charge carriers can be exchanged between the particles and a plasmonic short circuit occurs. This leads to a change in the overall charge distribution and therefore a change in the collective behavior of the plasmonic system. This leads to a shift in energy levels and therefore to a large shift of the SPP resonances. This is indicated in FIG. 3C showing two coated nanoparticles 2, 3 that are coupled not only capacitively, but additionally conductively. This is indicated by the arrow C. The lower graph shows a shift in the SPP resonance energies or wavelengths, respectively. $\lambda_1$ and $\lambda_2$ refer to switching wavelengths corresponding to switching frequencies $v_1$, $v_2$ respectively. $\lambda_{cond,1}$ and $\lambda_{cond,2}$ stand for alternative resonance wavelength in the conductive coupling configuration of the particles 2, 3. With respect to $\lambda_0$ the SPP resonance is shifted by Δ1 for weak and by Δ2 for strong coupling, respectively. One can show that the conductive coupling of two nanoparticles 2, 3 results in considerable red-shifts of the hybridized SPP modes compared to the isolated SPP modes. The shift can be 100-1000 nm and is induced by switching light having wavelengths $\lambda_1$ and $\lambda_2$.

This change in the SPP resonances in terms of collective SPP modes is illustrated in FIG. 3C in comparison to the single SPP modes as shown in FIG. 3A. For example, the coupling material between the two particles 2, 3 is adapted such that by irradiating light pulses with a frequency $v_1$ or wavelength $\lambda_1$ changes the coupling type by the coupling material to a conductive coupling. On the other hand, a shorter wavelength switching light $\lambda_2$ corresponding to the frequency $v_2$ leads to a reversal of the coupling material property, i.e. the coupling becomes capacitive. This reversible alternation of the coupling type between the SPP modes allows for a controlled switching or logic operations based on SPP modes and their interactions in strongly coupled or hybridized systems. One can actively control the coupling between the nanoparticles 2, 3 and thereby reproducibly manipulate the SPP state.

Figure 4:
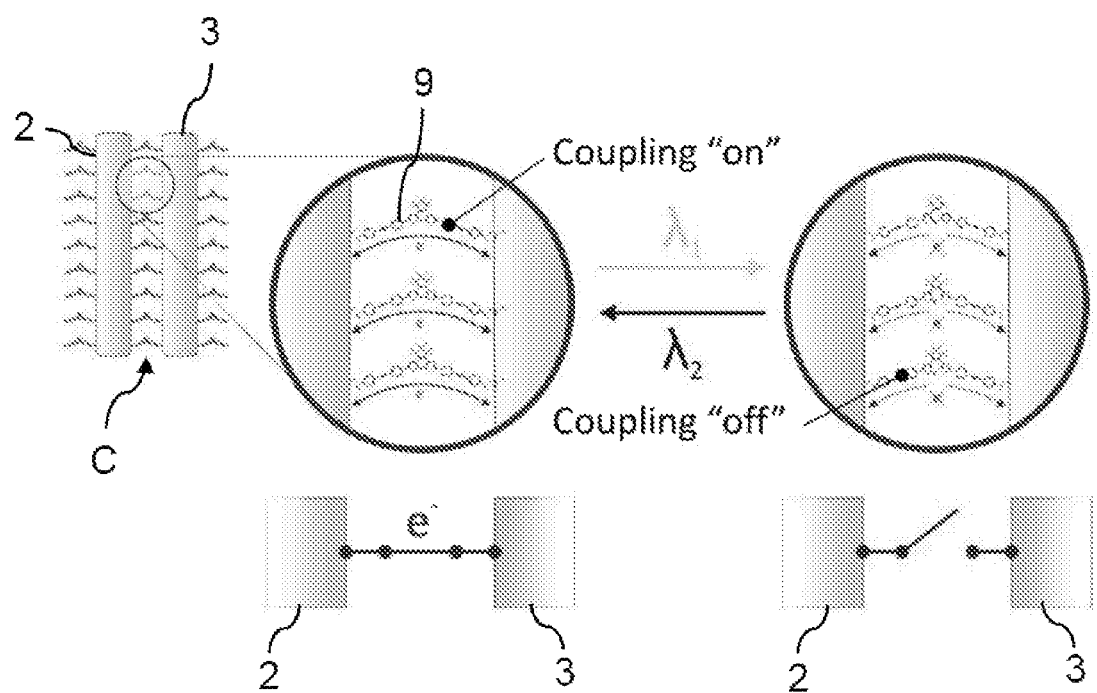
FIG. 4 shows diagrams illustrating the coupling of plasmonic excitations between particles through embodiments of active coatings.

The coating or coupling material, for example, can be a molecular layer or photochromic material. Also other phase-change materials, magnetic, electro-optic materials or non-linear materials can be contemplated as coupling materials. The conductive link between the two particles can be realized with a molecular coating including specific ligands as it is illustrated in FIG. 4. Also functional oxides are candidates as suitable materials. The functional coating can change its conductance from isolating to conductive and vice versa.

In FIG. 4, two nano-rods 2, 3 are shown that are coupled through such a functional coating. For example, photochromic molecules 9 or ligands are used for reversibly allowing an electron exchange or blocking between the two rods 2, 3. By irradiating switching light having a wavelength $\lambda_1$, the intermolecular electron-conducting path is broken such that a coupling between the two nano-rods 2, 3 is disable ("switched off"), and the coupling between the nanorods 2,3 remains capacitive. This can be reversed by irradiating with a switching light of wavelength $\lambda_2$ thereby establishing an intra-molecular electron-conducting path between the two nanorods 2, 3, leading to conductive coupling between the nanorods, 2,3.

In FIG. 4, the lower diagrams show the electronic bridging (left) and the capacitive coupling (right). Preferably, the particles' SPP modes are engineered such that the hybridized or coupled resonance is not located close to one of the switching frequencies $v_1$, $v_2$. For example, $\lambda_{cond,1} < \lambda_1$ or $\lambda_1 < \lambda_{cond,2}$. Typical wavelengths of $\lambda_1$ are 330 nm and $\lambda_2$=450 nm. However, $\lambda_1$ can also range between 250 nm and 350 nm, and $\lambda_2$ can range between 500 nm and 700 nm. One can contemplate of other frequency of wavelength ranges for the switching frequencies and/or the resonance frequencies of the SPP modes. The frequencies and wavelength of the switching light and the SPP resonances can be tailored according to the specific signal processing needs. For example, an ultraviolet pulse at $\lambda_1$ or $\lambda_2$ can be far away from a visual plasmon SPPs.

Photoactive molecular coatings can be used as a coupling material. One can also contemplate of other switching mechanism that allow for a reversible change between conducting or insulating behavior between the nanoparticles. For example, a coating layer can be switched by the application of a high electric field. Also chemically-switched materials can be used. For example, the metallic or conductive coupling can be induced by a pH value change of a liquious environment. In some embodiments, ligands are used to coat nanoparticles and lead to a stable mechanical and electric or dielectric coupling. One can further contemplate of an ultraviolet switching or use of second harmonic generation. For example, visual light frequencies can be used that are frequency-doubled and employed for the switching. One can contemplate of coupling materials that change their geometry in response to an external trigger, e.g. piezoelectric materials. As result, the spatial coupling and hence, the SPP configuration of the system can change.

The mechanism of a reversible capacitive and conductive coupling of nanoparticles in combination with tailored SPP frequencies and switching light frequencies can be used as optical memories or switching devices.

Figure 5:
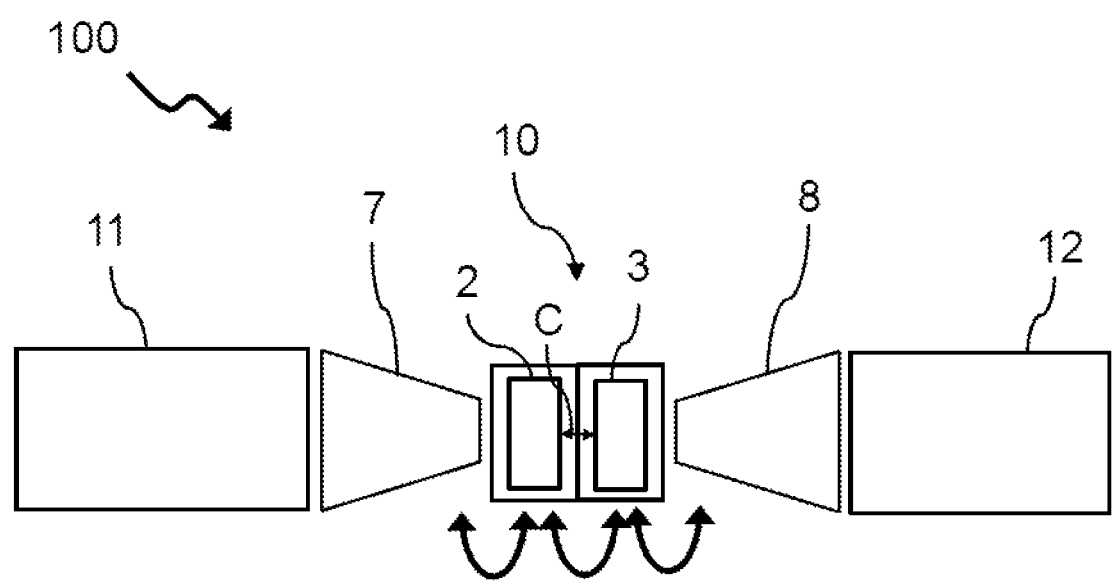
FIG. 5 shows a schematic diagram of an embodiment of a switching device including a state-changeable device.

FIG. 5 shows, for example, a switching device based on a state-changeable device 10. Switching device 100 includes a two nanoparticle 2, 3 forming a state-changeable device 10 wherein the particles 2, 3 are coated with a functional coating. The state-changeable device 10 is placed between two optical (photonic or plasmonic) funneling waveguides 7, 8 which are each coupled to an optical waveguide 11, 12. Depending on the SPP state which depends on the capacitive or conductive coupling of the two particles 2, 3, particular light signals having predetermined frequencies are transmitted through the device 10 or rejected. One can also speak of a variable band-pass for light transmission. The band-pass can be changed through switching light, and specific wavelengths or frequencies are passed or blocked, depending on the SPP modes 1 in respect to SPP modes 2.

Figure 6:
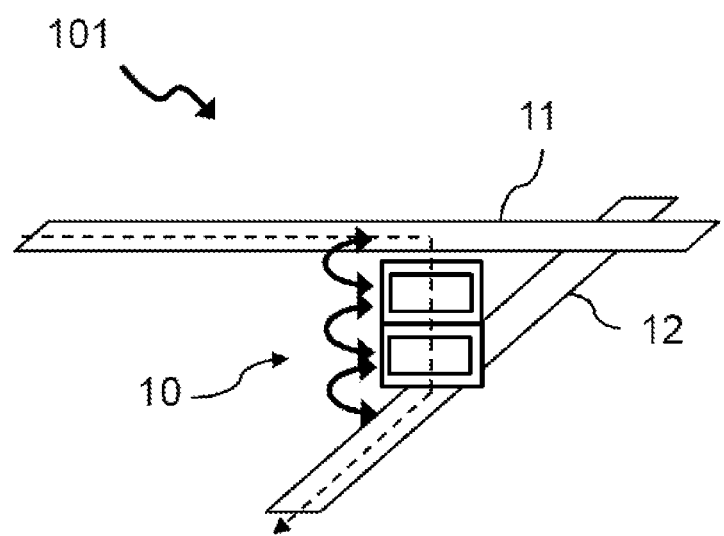
FIG. 6 shows a schematic diagram of an embodiment of a memory device including a state-changeable device.

FIG. 6 shows an embodiment of a memory device 101 based on plasmon states. The state-changeable device 10 is placed between two optical (photonic or plasmonic) waveguides 11, 12 which are arranged in a cross-bar fashion. Light is indicated as the dashed line. Depending on the state of the state-changeable device 10, i.e. of the plasmon configuration, a logic state can be assigned. For example, an optical cross-bar device can be used to address further CMOS parts in a hybrid optical-electronic device or the CMOS-part controlling the state-changeable device. Additional optical filters can be used in order to address specific memory devices 101 or state-changeable devices 10 in an array-type of architecture. The individual nodes of the array can be composed of distinctly different state-changeable devices, making each individual one addressable by optical means. The proposed devices, for example, allow for an optical memory with an optical read-out which is non-destructive. Further, the switching a different wavelengths of switching devices is feasible, providing a way to optical route signals to different in- and outputs.

Figure 7:
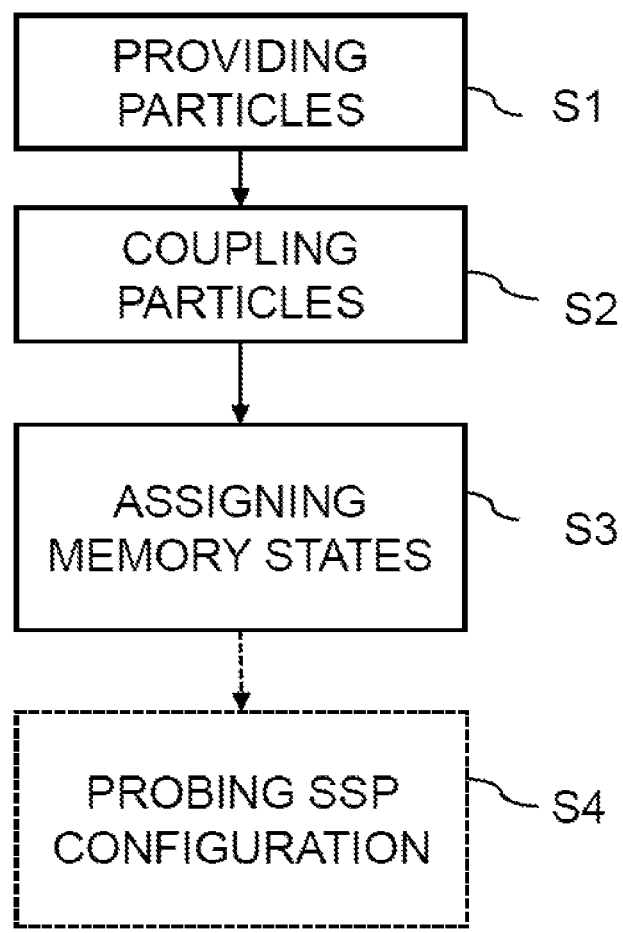
FIG. 7 shows a flow chart of method steps involved in a method for storing a memory state.

FIG. 7 shows an exemplary flowchart of method steps that are involved in storing a memory state, e.g. using an embodiment of a state-changeable device as described above. First, two particles are provided in a step S1 and electro-optically coupled in a step S2. Turning to FIG. 3, the drawing in FIG. 3B shows two nanoparticles 2, 3 that are coupled in FIG. 3C which is illustrated by the arrow C. The electro-optical coupling can be changed through 'triggering' the coupling material involved. As a result, at least two SPP configurations, e.g. as illustrated in FIG. 4 can develop, and can be changed by an external stimulus. One can assign each distinct SPP configuration to a specific memory state in a step S3.

In an optional read-out step S4 the respective SPP configuration is probed or measured. Depending on the detected SPP configuration the stored memory state is determined. For example, a specific SPP mode or configuration according to a conductive coupling between the particles is measured. Hence, a first assigned memory state is read out. If, however, an SPP mode according to the weak or dielectric coupling is measured one obtains a second memory state as a read-out.

Besides optical memory and switches with dimensions below the diffraction limit, various applications can be contemplated, for example optical tags with light-programmable patterns or functional liquids. Security cards and tags can be implemented. Densely packed arrays of filters and non-linear optical elements based on the state-changeable device can be realized. Additionally, optical and thermal coupling sensors can be contemplated. For example, the coupling material can be thermally sensitive and switched between conductive and capacitive coupling as a function of a temperature change. For radiation-sensitive coupling materials, applications as dosimeters are possible. The state-changeable device enables volatile and non-volatile memories, wherein the life-time of specific plasmonic modes defines the duration of a memory state.

It is an aspect of the present disclosure to provide improved state-changeable structures that includes particles allowing for a controlled light-matter interaction at sub-wavelength dimensions based on electro-optical excitations, as for example, plasmonic phenomena. Other aspects relate to improved structures and devices that use selected plasmonic states for switching and storing information.

The first and second electro-optical coupling can differ from each other in strength. E.g. the first coupling can include a capacitive coupling and the second coupling can allow for charge carrier transfer.

Embodiments of the invention can have the advantage that a wavelength of light used during operation of the state-changeable device can be larger than the geometrical dimensions of the particles forming the device or larger than the state-changeable device as a whole. The device can be in particular operable below the diffraction limit of the light used during operation. The coupling material, for example, allows for an electronic interaction between the particles due to a specific electronic configuration of the coupling material. The electronic configuration of the coupling material can be, for example, controlled by a trigger signal that is realized by irradiating light-pulses having specific wavelengths or frequencies (leading to all-optical switching). However one can also contemplate of electric fields, magnetic fields, thermal changes, etc. as trigger signals.

According to an embodiment the first SPP configuration can be assigned to or represent a first state and the second SPP configuration can be assigned to or represent a second state. The first and the second state can be e.g. logic states of a device, e.g. of an electronic device.

A state-changeable device according to embodiments of the invention allows for a plasmonic coupling and therefore the creation of an overall (hybridized) plasmonic state with a charge-distribution over particles that can be distinguished from the plasmonic states relating to the separate proximate particles.

For example a purely capacitive or weak optical coupling corresponding to an embodiment of the first electro-optical coupling between the particles leads to the first plasmonic configuration essentially displaying plasmon states that are close to plasmon states of the individual particles. The second plasmon configuration however, is due to a conductive coupling as an embodiment of the second electro-optical coupling with electron exchange between the particles. This can lead to a hybridized charge carrier distribution and distinctly different SPP modes compared to the SPP modes of the individual particles.

In embodiments of the state-changeable device, the coupling material is adapted to be reversibly changed from an insulating to a conducting state by irradiation of switching light as a trigger signal or other means. Hence, in embodiments, the coupling material is chosen such that it can be changed from one insulating state to another conducting state by exposing the coupling material to a specific trigger signal, such as a light pulse. Hence, the coupling material can be made conductive or insulating as a function of irradiated light. Alternatively or additionally, the generation of second harmonics in small gaps can lead to a frequency doubling in incident switching light. Hence, the switching or change in the coupling behavior of the coupling material can be frequency-sensitive and can be adapted accordingly.

As an embodiment the coupling material is a material potentially displaying non-linear electro optical behavior, e.g. second harmonic generation. In an embodiment of the state-changeable device, the insulating state can be induced by irradiation of switching light having a first switching frequency, and/or the conducting state can be induced by irradiation of switching light having a second switching frequency. For example, the first and the second particles are adapted such that a SPP resonance frequency corresponding to the second SPP configuration has a predetermined distance to the first and/or the second switching frequency. The particles of the state-changeable device and the coupling material can be chosen such that the energies of specific plasmonic states relating to the uncoupled particles on the one hand and to the coupled particles (through the coupling material) on the other hand and the respective energies referring to the switching frequencies do not interfere with each other. Hence, the state changeable device can allow for a change in its plasmonic state by irradiating light having the first or second switching frequency. One can choose the plasmonic states among a very broad range so that analogously to the colors of light many 'photonic colors' can be carried by the SPP configurations. Hence, the state-changeable device can be operable in a wide range of photonic bands.

In embodiments of the state-changeable device, the switching light corresponds to wavelengths which are longer than the dimensions of the particles. Hence, the proposed state-changeable device allows for sub-wavelength light manipulation and device dimensions. The state-changeable device can be addressed and switched by light pulses having a larger wavelength than the actual solid-state device.

In embodiments, the coupling material is part of a functionalized coating of the first and/or second particle. For example, the coupling material can be an active surface medium used for coating specific nanoparticles. By functionalizing such active surface coatings, the system of two nanoparticles included in the state-changeable device can be switched from a system with capacitive coupling to an electrically coupled system that allows for electric transfer between the particles surfaces. In embodiments, a coupling material or a coating material of the particles includes ligands that are adapted to form a charge coupling between the first and second particle in response to the trigger signal, and in particular to switching light. The coupling material can be photochromic. As a result, the plasmonic and optical properties in the near and far field range change. For example, the state-changeable device can change from a coupled or hybridized system into a solely capacitive coupled system of two particles. In embodiments of the state-changeable device, the particles are nanoparticles having dimensions between 1 nm and 100 nm. The particles can have a regular shape, but can be spherical, rod-like or have any arbitrary shape. However, also particles that have a bow-tie shaped geometry can be used. In addition to the shape of the particles plasmonic states can be changed as a function of the particle material. Hence, a parameter defining the SPP modes can be the material composition. Hence, the geometry and material composition of the individual particles and the way they couple can be tailored to provide the desired electro-optical response. For example, the two or more particles are gold, silver or aluminum nanoparticles. The particles can include other noble metals. One can also contemplate of semiconductor particles, preferably highly doped. Embodiments can include carbon-based materials for the particles, as for example carbon nanotubes, fullerenes and graphene structures.

In embodiments, a distance between the particles is between 1 nm and 100 nm, depending on the dielectric and capacitive properties of the coating. The distance can be adapted to achieve the desired specific plasmonic states in the capacitive coupling configuration and the electric coupling configuration of the state-changeable device. Preferably, the distance is larger than a threshold distance that allows a direct charge carrier transfer between the particles, e.g. by tunneling mechanisms. In embodiments, the state-changeable device includes additional particles for forming a plurality of particles. The plurality of particles is preferably adapted to provide a charge carrier distribution such that surface plasma polaritons (SPP) occur. Instead of a two-particle system, a many-particle system having plasmonic excitations that can be specifically excited can be used.

In embodiments, the coupling material includes diarylethenes, an oxide material, redox active molecules, dielectric materials, phase-change materials, ferro-electric materials etc. In embodiments, the coupling material can couple the first and second particle mechanically as well. Further, the device can be implemented in fluids, e.g. solutions, or matrices, e.g. including polymers. In particular a mechanical coupling defining the two-particle structure allows for flexible implementations, e.g. in liquids or dispersions.

Embodiments of the memory device can include a first and a second optical waveguide for irradiating light to the state-changeable device. The state-changeable device is preferably arranged between the first and the second optical waveguide. One can contemplate of a cross-bar structure where the state-changeable device is placed between extended optical waveguides. The waveguides are used to propagate switching light. Embodiments of the memory device can include state-changeable devices in a solution state. Additionally, the state-changeable device can be used as a switching device. Accordingly, an embodiment of a switching device includes at least one state-changeable device as explained before. The switching device can include a first and a second plasmonic waveguide coupled to the state-changeable device structure. In embodiments of the switching device, further first and second optical (photonic or plasmic) waveguides are provided wherein the first waveguide is coupled to the first state-changeable device part, and the second waveguide is coupled to the second state-changeable device part. The plasmonic excitations (SPPs) propagate at the speed of the incident optical signal, i.e. a switching light signal. The corresponding switching devices can be used to switch up to THz frequencies. As different switching frequencies can be used and mixed, the proposed devices can achieve large bandwidths according to specifically tailored switching light frequencies or wavelengths. Further, additional manipulation of the switching light is feasible by various interference mechanisms further increasing the bandwidth of applications.

Embodiments of the state-changeable device, memory device and switching device can allow for flexible optical components and devices. Since preferably geometries with smallest gaps (defined by the coating) are used to carry and transmit the plasmonic excitations, non-linear effects interacting within the coatings or coupling materials can be exploited. One example can lead to $2^{nd}$ harmonic generation in small gaps originating from large photon fields. This will provide an additional trigger for switching of the coating as frequency-doubling can be employed. Devices according to embodiments of the invention can be only limited by the quantum plasma resonances and therefore suitable for extreme miniaturization. Due to the simple components, state-changeable devices according to embodiments of the invention can be mass-fabricated and used for large-scale integration.

In embodiments a logical state or digital or bit state of the memory is stored in the change of the coupling type (first or second). For example the conductive state of the coupling material or coating leads to specific SPPs that can have an assigned memory state. Embodiments of the method can allow for a non-destructive read-out of information assigned to the plasmonic state of the physical system forming an embodiment of the state-changeable device. It can be an advantage that the memory device allows for an optical read and/or write process. In embodiments the memory device is non-volatile memory. Depending on the realized coupling between the particles the memory can be a volatile or a non-volatile memory device. Due to the flexibility of the specifically tailored SPP configurations, a multi-level memory can be realized.

Certain embodiments of the presented devices and structure and the method for storing can include individual or combined features, method steps or aspects as mentioned above or below with respect to exemplary embodiments.

What is claimed is:

1. A method, comprising:
   providing a first particle and a second particle arranged in proximity to each other; and
   coating the first particle and the second particle with a chemically-switched material coating as a coupling material, wherein metallic or conductive coupling is induced by a pH value change of a liquious environment and wherein the first particle and the second particle are adapted to provide charge carrier distribution such that surface plasmon polaritons (SPPs) occur.

2. The method of claim 1, wherein the coupling material is adapted to exhibit a variable conductivity in response to a trigger signal.

3. The method of claim 2, further comprising:
   assigning a first memory state to a first SPP configuration; and
   assigning a second memory state to a second SPP configuration.

4. A memory device, comprising:
   at least one state-changeable device having a first memory state associated with a first surface plasmon polariton (SPP) configuration and having a second memory state associated with a second SPP configuration, wherein the at least one state-changeable device comprises a first particle and a second particle coated with a piezoelectric material that changes geometry in response to an external trigger thereby changing the spatial coupling of the first particle and the second particle and the corresponding surface plasmon polaritons (SPP) configuration.

5. The memory device of claim 4, further comprising:
a first optical waveguide and a second optical waveguide to irradiate light to the state-changeable device.

6. The memory device of claim 5, wherein the state-changeable device is arranged between the first optical waveguide and the second optical waveguide.

7. The memory device of claim 5, wherein the memory device is non-volatile memory.

8. The memory device of claim 5, wherein the memory device is volatile memory.

9. A method, comprising:
providing a first particle and a second particle arranged in proximity to each other;
electro-optically coupling the first particle and the second particle through a coupling material, wherein the first particle and the second particle are adapted to provide a charge carrier distribution such that surface plasmon polaritons (SPPs) occur, wherein the first particle and the second particle are nanoparticles; and
providing a first optical waveguide and a second optical waveguide arranged in cross-bar overlapping fashion having at least one state-changeable device comprised of the first particle and the second particle with electro-optical coupling between the intersection region of the cross-bar configuration.

10. The method of claim 9, wherein the nanoparticles have dimensions between about 1 nanometer and about 100 nanometers.

11. The method of claim 9, wherein the nanoparticles have are spherical or rod-like.

* * * * *